United States Patent [19]

Cooper

[11] Patent Number: 4,620,149

[45] Date of Patent: Oct. 28, 1986

[54] METHOD AND SYSTEM FOR RECORDING AND DISPLAYING INPUT DATA SIGNALS

[75] Inventor: Edward Cooper, San Diego, Calif.

[73] Assignee: Power-Science, Inc., San Diego, Calif.

[21] Appl. No.: 423,603

[22] Filed: Sep. 27, 1982

[51] Int. Cl.[4] .............................................. G01R 11/63
[52] U.S. Cl. .............................. 324/103 P; 324/77 A
[58] Field of Search ............... 324/103 R, 103 P, 133, 324/77 A; 328/132

[56] References Cited

U.S. PATENT DOCUMENTS

| 3,703,337 | 11/1972 | Neugroschel | 324/103 P |
| 3,973,197 | 8/1976 | Meyer | 324/103 P |
| 4,158,809 | 6/1979 | Dellamano | 324/103 P |
| 4,259,631 | 3/1981 | Volkmann | 324/103 P |

Primary Examiner—Michael J. Tokar
Attorney, Agent, or Firm—Brown, Martin, Haller & Meador

[57] ABSTRACT

A simplified system of recording and displaying input data signals having a multi-stage memory that provides a given magnitude output signal to a meter or recorder for each memory stage energized, with said memory having a stage, magnitude discriminator circuit, and a scaling network for interfacing signal inputs to appropriate memory stages, with a timer for resetting the memory stages to provide an update readout periodically to the meter, and with a direct display for displaying the particular memory stages that are energized, providing a direct display readout of the meter readings.

5 Claims, 3 Drawing Figures

METHOD AND SYSTEM FOR RECORDING AND DISPLAYING INPUT DATA SIGNALS

BACKGROUND OF THE INVENTION

Many applications in electrical and electronic measuring circuits require the measurement of certain parameters, mathematical processing of the measurements (such as perhaps magnitude comparison), optical display of the measurement, and simultaneous recording to the measurement with suitable recording means. A typical instrument to perform all of these functions requires an analog input circuit to scale the signal to be measured, an analog to digital converter, a processor for manipulations of the digitized data, a memory to store the data, a readout with associated circuits to display the processed measurement, a digital to analog converter to record the measurement on a strip chart recorder, and perhaps a timing circuit to clear the memory after some given recording interval.

An example of a typical application is a power disturbance analyzer that monitors the power line for high voltage disturbances (spikes or impulses) which can be damaging to computers and other equipment. Such an analyzer must measure the magnitude of spikes and record the magnitude and time of occurrence, and it must have means of discriminating against lower magnitude spikes while it is in the process of recording a spike of larger magnitude that has just previously occurred. The discrimination against lower magnitude spikes is necessary because the recording process itself requires a finite period of time, and during that recording time it must be assured that the worst case measurement, i.e. the maximum amplitude, does not get erased from the memory. On the other hand, if the recorder is in the process of recording a given spike and a larger one occurs during that time, it must then instantly override the memory so that the largest magnitude is recorded.

Thus, it is advantageous to have a system for recording and displaying input data signals with a simplified system of memory stage activation with magnitude reset and discrimination that provides a direct, lighted display from the memory, of the meter readings.

SUMMARY OF THE INVENTION

In an illustrative preferred embodiment of this invention, a series of signal pulses to be measured are fed to a scaling network means. The scaling network has a series of output lines, which output lines provide output signals in proportion to the magnitude of the signal pulses measured. In this simplified circuit arrangement, all output lines from the scaling network means electrically connect to a corresponding memory stage in a memory means. In scaling the input signals to be recorded, all the lines up to the level of the input signals are energized with the highest voltage line being the most significant line output. Thus in the multi-stage memory, its respective stages are energized by respective output lines from the scaling network. A simplified stage memory may comprise a latch circuit. When the most significant memory stage of the memory means is energized by the scaling network, each of the less significant memory stages are also energized. But the most significant memory stage shuts off the less significant memory stages by shutting off the supply current to the lower stages. So only the most significant memory stage of the memory is energized. This memory stage provides a given output having an analog value corresponding to the particular memory stage, to a meter or recorder that reads out this magnitude. Thus the system provides a simplified, bracket type meter reading of the magnitude of an input signal. The output of each memory stage is proportional to the input signal through the scaling network, providing a meter reading that corresponds within the parameters of the system to the magnitude of the input signal received by the scaling network means.

A constant current source powers the latch circuits and provides the input power for driving the several memory stages. While the most significant stage of the memory shuts off the constant current power source to the less significant memory stages of the memory, thus providing only the output of the most significant stage to the meter, additionally, a timing circuit is activated by an output signal from the memory means and times out providing a reset pulse that interrupts the constant current source, de-energizing all stages in the memory means. This releases each latch circuit, interrupting the output analog magnitude to the meter means. After the reset pulse, the power source to the memory means is immediately updated from the scaling network, providing a new reading to the meter from the memory means. This allows the memory means to be updated periodically assuring that the meter reads out the latest, most significant value from the memory means. This also assures that the most significant signal pulse is always read out by the meter. This, in combination with the scaling network, assures a most significant magnitude reading by the meter.

A direct readout display is provided by light emitting diodes in each of the memory stages of the memory means. Only the energized and activated memory stage that is providing an output level to the meter means energizes its particular light emitting diode. So there is a direct identity of the energized LED with the meter reading. Each of the light emitting diodes for each of the stages are arranged in a readout display having a magnitude readout corresponding directly with the meter reading. Thus energizing the particular memory stage of the memory means not only provides a given meter reading, but also a direct lighted readout display of the meter reading. While the meter does not read out in all circumstances the exact analog magnitude of the input signal information, it provides a bracketed meter reading with a direct LED readout that provides a simplified display.

It is therefore an object of this invention to provide a new and improved, yet simplified, system for recording and displaying analog input data signals.

Other objects and many advantages of this invention will become more apparent on a reading of the following detailed description and an examination of the drawings, wherein like reference numeral designate like parts throughout and in which, FIG. 1 is a block and schematic diagram of an embodiment of the system of this invention.

Figure 2:
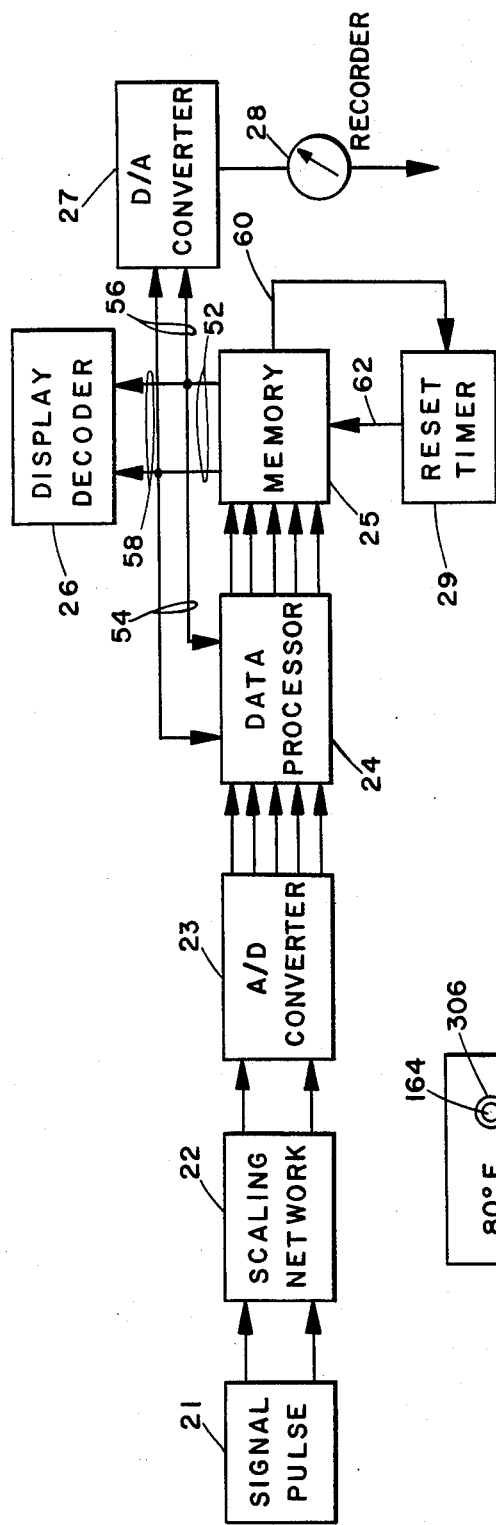
FIG. 2 is a block diagram of a prior art system.

Referring to FIG. 2, there is illustrated a block diagram of the circuits involved in an instrument that can perform the various functions of the analyzer described in the preceding paragraph. With reference to FIG. 2, there is an input signal pulse 21 from a known source, which may be a unipolar pulse, perhaps rectified, which is fed to a scaling network 22. This scaling network 22 may be a linear or non-linear attenuator. The attenuator-scaling network output connects to an analog to digital converter 23.

The output of the A/D converter 23 connects to a data processing circuit 24 that compares the data against a memory 25. The memory 25 may hold data from a previous measurement. The data processor 24 is magnitude comparator or discriminator which will make one of two decisions. If the newest measurement from signal pulse 21 now in data processor 24 is larger than the number stored in memory 25, the system will initiate an override so that the memory 25 will then store the latest (larger) measurement. On the other hand, if the latest measurement is smaller than or equal to the number in the memory 25, it will reject this latest measurement so that the memory 25 retains the larger number. The memory 25 output 52 is connected to four circuits, 54, 56, 58 and 60. A display decoder 26 produces a digital, sometimes numerical, readout. A digital to analog converter 27 produces an analog output current for a strip chart recorder 28. The third output connection 60 from the memory 25 goes to the reset timer circuit 29. This reset timer 29 is triggered whenever the memory 25 receives an update command and a new number is being set in the memory 25. The timer 29 is then triggered, cycles through its timing period, and when it times out, it feeds a reset in line 62 to the memory 25 so that all data is being erased. The fourth connection through lines 54 feeds a signal back to the processor 24 for magnitude comparison.

The description of this block diagram in FIG. 2 is given only to illustrate the complexity of conventional circuits. The device, as described, can easily be built with off-the-shelf integrated circuits, however, an unreasonably large number of different integrated circuits is required to achieve all necessary circuit functions. Due to the large number of components and circuits involved in the A/D converter 23 and data processor 24, it is only possible to achieve rather limited measurement response times with such an instrument, typically no better than 0.5 to 1 microseconds. There is an additional problem with this kind of circuit because it requires both digital as well as analog integrated circuits, and in general they have quite different power supply requirements. Consequently, there is a need for an improved system and circuit that can combine analog and digital functions with a minimum number of components and significant cost reductions. Such a circuit is described herein.

Figure 1:
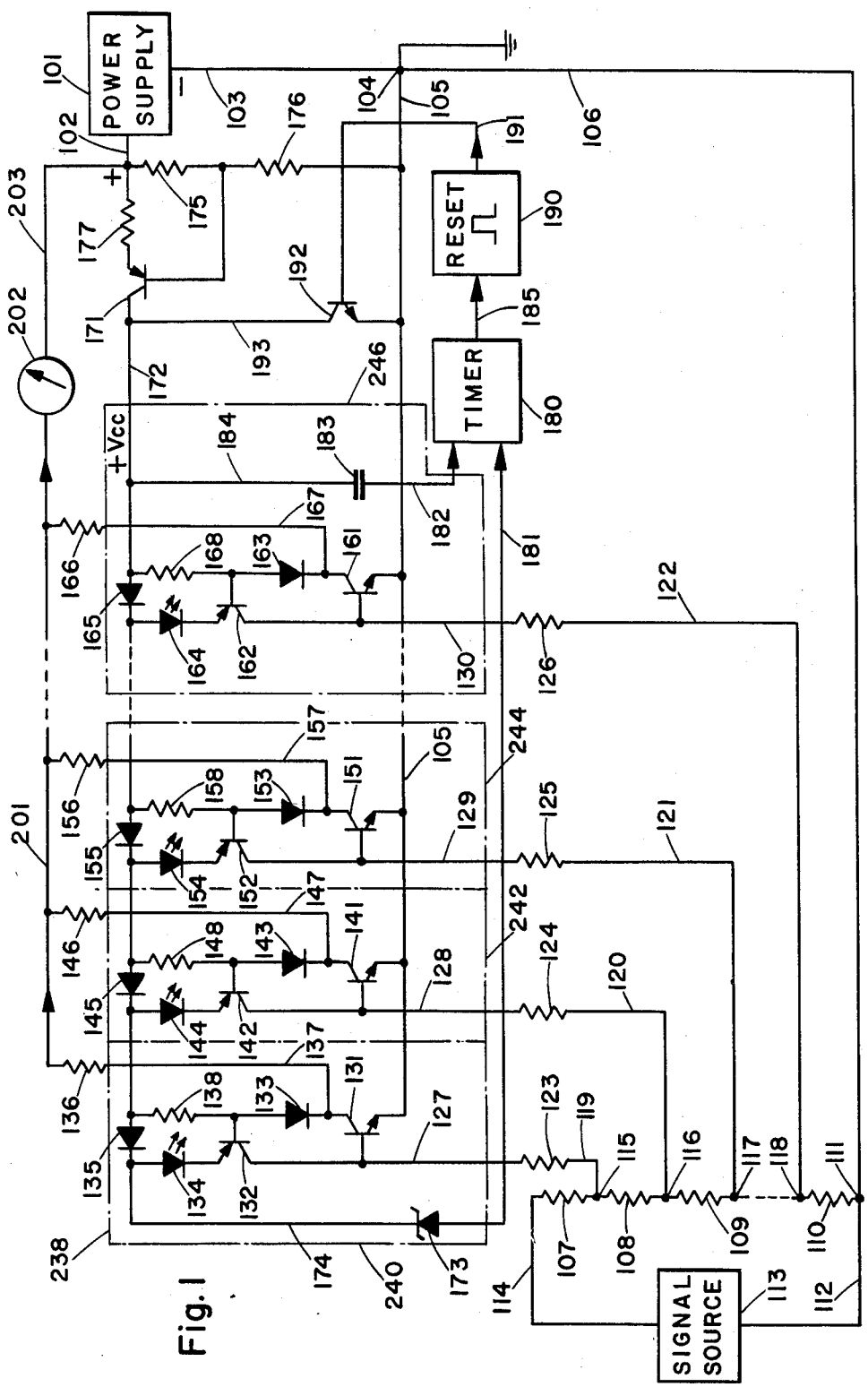

FIG. 1 illustrates an embodiment of the circuit of this invention with a memory that utilizes complementary transistor pairs, or latches, in a circuit where each latch combines simultaneously several logic and analog functions. The combined functions include memory, analog (magnitude proportional) random access, magnitude discrimination, optical display and scaled output current for a recorder. The circuit of FIG. 1 also includes a timer and reset pulse generator.

In FIG. 1, a power supply 101 has a positive output 102 and a negative output 103. The negative output 103 connects to a circuit common, or ground, at point 104. Connected to this point is also the common line 105 and the reference connection of an input attenuator, line 106. The input attenuator consists of a string of resistors 107, 108, 109 and 110, and it should be understood that there may be any number of resistors of any value, depending on the specific parameters and increments of the signal to be measured. The bottom of the attenuator, resistor 110, connects to the reference line 106 at point 111. This point also connects via line 112 to the signal source 113. The second connection from the signal source 113 is made via line 114 to the attenuator input resistor 107. Various taps 115, 116, 117 and 118 on the attenuator connect via lines 119, 120, 121 and 122 to the resistors 123, 124, 125 and 126, and these resistors connect via lines 127, 128, 129 and 130 into the individual stages of the memory 238. The memory 238 may have any number of stages or bits 240, 242, 244, 246. Each stage consists of a complementary NPN/PNP transistor pair, such as for example stage 242 has transistors 141 and 142. These transistor pairs are essentially connected as latches so that the collector current of each transistor provides base drive for its complement.

Essentially, the latch circuit is a bi-stable circuit that is either on or off. For example, if transistor 141 has been turned on by a trigger pulse on line 120 to its base so that its collector is pulled to ground, it then supplies base drive for transistor 142 via diode 143. Transistor 142 then turns on so that its collector/emitter junction saturates. The collector of transistor 142 supplies base drive for transistor 141 and each of transistors 141 and 142 are supplying base drive for its complementary transistor. With both transistors 141 and 142 turned on, there is a low impedance path from ground line 105 to the meter 202. This path goes from ground 104 and line 105, through the emitter/collector junction of transistor 141, through line 147, resistor 146 and line 201 to the meter 202, and from the meter 202 through line 203 to the power supply 101. On the other hand, if transistor 141 has been forced off by a momentary clamp on its base via line 128, then transistor 142 will also turn off 20 instantly because it can no longer receive any base drive from the collector of transistor 141. Because transistor 142 is turned off, there is no base drive available for transistor 141, and now both transistors remain off and power is disconnected from the meter 202.

A light emitting diode "LED" 144 is in series with another diode 145 in the emitter circuit of transistor 142. Another diode 143 is connected between the collector of transistor 141 and the base of transistor 142. A resistor 146 connects from the collector of transistor 141 to an output line 201. The base terminating resistor 124 of transistor 141 connects via line 120 to tap 116 on the attenuator. The base terminating resistor 148 of transistor 142 is connected to the anode of diode 145 to provide some reverse bias for the base of transistor 142 for improved noise immunity.

Similar to the stage 242 just described, there may be any number of stages in the memory 238. All stages are identical, and similar sets of numbers are used for similar parts of each stage. Thus, nubmers 131, 132, 133, 134, 135, 136, 137 and 138 represent the first stage 240. Numbers 141, 142, 143, 144, 145, 146, 147 and 148 are the second stage 242. Numbers 151, 152, 153, 154, 155, 156, 157 and 158 are the third stage 244. Numbers 161, 162, 163, 164, 165, 167 and 168 represent the Nth stage 246.

The diodes 135, 145, 155 and 165 are all cascaded, i.e. series connected, between a constant current source 171, via line 172, and a zener diode 173, via line 174. The constant current source obtains power from the power supply 101 and has a conventional circuit consisting of a resistor divider network 175 and 176 and emitter resistor 177. The zener 173 connects via line 181 as an input to a timer circuit 180. A second input to the timer 180 is coupled through capacitor 183 via lines 182 and 184 from the constant current source 171 through line 172.

The timer 180 has output lines 185 to trigger a RESET pulse generator 190. The reset pulse is fed through line 191 to a transistor 192, and the collector of transistor 192 connects via line 193 to the output of the constant current source at line 172.

From the bottom transistors 131, 141, 151 and 161 of each stage, there is one output resistor 136, 146, 156 and 166 connected to a common output line 201 via lines 137, 147, 157 and 167. The output line 201 connects to a galvanometer 202 which is the meter movement of a strip chart recorder. The second connection to the galvanometer-recorder is through line 203 to the positive terminal 102 of the power supply 101.

The circuit operates as follows. In its standby state, with no signal present across the attenuator resistors 107, 108, 109 and 110, all stages 240, 242, 244 and 246 in the memory 238 are off. Under this condition, the current from the constant current source 171 flows through the diodes 165, 155, 145 and 135 and through the zener 173 to the timer 180. With this input current, the timer 180 is disabled. Since all stages are off, the collectors of transistors 131, 141, 151 and 161 are all at the positive potential of the power supply 101, because each stage has a path going to the power supply 101 as, for example, transistor 131 has its collector connected via line 137, resistor 138, line 201, through the galvanometer 202, and line 203 to the positive output terminal 102 of the power supply 101. Since transistor 131 is turned off, there is no current flowing through it and diode 133 is reverse biased since its anode connects via resistor 138 to the anode/cathode junction of diodes 135 and 145, which is at a much lower potential than the positive power supply 102. Also, the emitter of transistor 132 connects via light emitting diode 134 to the cathode of diode 135, and this point is again at a lower potential than the base of transistor 132. Thus, the light emitting diode (LED) 134, as well as the emitter/base junction of transistor 132, are reverse biased and transistor 132 is turned off. This condition is identical for all stages. The cascaded string of diodes 135, 145, 155 and 165 establish a voltage divider where each diode provides a tap of increasing voltages. The lowest voltage being at the cathode of diode 135 and the highest voltage bing at the anode of diode 165.

Now when a signal pulse occurs from the signal source 113, this pulse is then attenuated by the resistor network 107, 108, 109 and 110 so that signals of proportional amplitudes are available at taps 115, 116, 117 and 118. The highest amplitudes are connected to the trigger input of the lowest stages, and the lowest amplitudes are connected to the trigger input of the highest stages. The highest amplitude is at tap 115 and connects via line 119, resistor 123 and line 127 to the base of transistor 131 in stage 240. The lowest amplitude is at tap 118 and connects via line 122, resistor 126 and line 130 to the base of transistor 161. Depending on the magnitude of the signal pulse, any number of stages may be triggered on by the signal. However, since a given signal pulse is progressively attenuated at the various taps, and since each stage will respond or trigger at the same level, i.e. the base/emitter voltage of transistors 131, 141, 151 and 161; there is always going to be a critical tap on the attenuator that will have just sufficient voltage to trigger its corresponding stage. So any tap above this critical tap will have a higher signal pulse so that the corresponding stages are also triggered. On the other hand, all taps below this critical tap will then have insufficient voltage so that their corresponding stages are not triggered.

Assume that a given signal pulse in line 114 has such a magnitude that transistors 131 and 141 are triggered on, but at taps 117 and 118 the signal is attenuated to an extent that the stages 244 and 246 are not being triggered. As transistor 141 turns on, it causes its collector to clamp line 147 and diode 143 to the common line 105. Diode 143 is then forwrd biased and this provides base drive for transistor 142. When transistor 142 turns on, it provides base drive for transistor 141, and stage 242 is thus latched. Current will now flow from the common line 105 through the emitter/base junction of transistor 141, from there through the saturated collector/emitter junction of transistor 142, through the light emitting diode 144, and from there through the diode string 145 through 165, to the constant current source 171.

The path from the emitter of transistor 141 to the anode of the LED 144 represents a shunt for the current that is available from the constant current source 171. The cathode of diode 145 is then at such a low potential that the voltage available at the anode of diode 135 is so low that the first stage 240 cannot latch, even though transistor 131 receives the trigger pulse from the attenuator through line 127. Also, the zener diode 173 can no longer conduct any current to the timer 180 input. As can be seen, whichever most significant stage is being turned on by the signal pulse will automatically shunt all lower weighted stages out of operation. Alternatively, once a given stage has been set, it can be overridden by a larger signal pulse thereafter. For example, if stage 242 is latched and a larger signal pulse triggers transistor 151 thereafter, the stage 244 will then latch and shunt the available constant current at the cathode of diode 155, and stage 242 has thus become disabled.

It should be recognized at this point that only one stage of the memory 238 can remain latched at any time, and that this will always be the highest weighted, most significant stage, which represents the maximum signal pulse that was present in the attenuator input line 114. It was described earlier that, in its normal standby state, all stages are off and that there was no current flowing through resistors 136, 146, 156 and 166. However, if any stage is latched, it will terminate its corresponding output resistor to the common line 105. For example, if the pair of transistors 141 and 142 are latched, the collector of transistor 141 is essentially at the common line potential 105. Resistor 146 will then conduct current via lines 147 and 201 to the recorder galvanometer 202 and from there via line 203 to the power supply output 102. By choosing a suitable value of resistor 146, it is possible to obtain any desired amount of deflection in the recorder-galvanometer 202. Thus, by choosing suitable values for resistors 136, 146, 156 and 166, the recorder can write different traces representing various magnitudes of the input signal pulses.

As was discussed before, the timer 180 has one input connected via line 181 to the zener diode 173. This input is used in such a manner that if there is an input current from the zener diode 173, it will disable the timer 180. This is the case when all stages of the memory 238 are off and the constant current from the source 171 is not shunted away by any stage. However, as soon as any stage is turned on, it removes the input current from the timer 180, and the timing cycle begins at that time. If nothing else happens, i.e. no larger signal pulse occurs in line 114 and a given stage remains latched, the timer 180 will eventually time out. At that instant, it triggers a RESET pulse generator 190 via line 185. The reset pulse drives the base of transistor 192 via line 191, and transistor 192 will then momentarily saturate. this clamps line 172 via line 193 and 105 to ground point 104 and this removes all available current from the memory. Consequently, whatever stage that has been latched is turned off. After the reset pulse 190 has elapsed, transistor 192 turns off and this restores the constant current to the diode string 165, 155, 145, 135, and through the zener diode 173 to the timer 180, disabling the same. The memory 238 has thus been reset and is ready to respond to another signal pulse.

There are three conditions which can occur after a given stage has been triggered by a signal pulse. While the stage is latched and the timer 180 is going through its timing cycle, there might occur another signal pulse of smaller amplitude than the one being held in the memory. As described above, the corresponding lower transistor pair cannot latch because its supply voltage (or current) is being clamped away by the larger magnitude latch that is already on. If another signal pulse occurs that has the same magnitude as the previous one, it cannot change the state of the latches as the correct one is already on. However, if a larger signal pulse should occur, it will cause the corresponding larger magnitude pair to latch, disabling the lower one. As the larger magnitude pair is latching, it causes an instantaneous reduction of the voltage on line 172. This voltage step is equal to the forward voltage drop of the number of additional diodes which are being shunted out of the constant current path 135, 145, 155 and 165. This negative voltage step is sensed by capacitor 183 via line 184. Capacitor 183 connects via line 182 to a second input of timer 180. this input serves as a retrigger command which restarts the timer from the very beginning of its timing cycle. This retrigger function assures that the largest magnitude signal pulse will be recorded on the strip chart for a sufficient length of time for good legibility.

Figure 3:
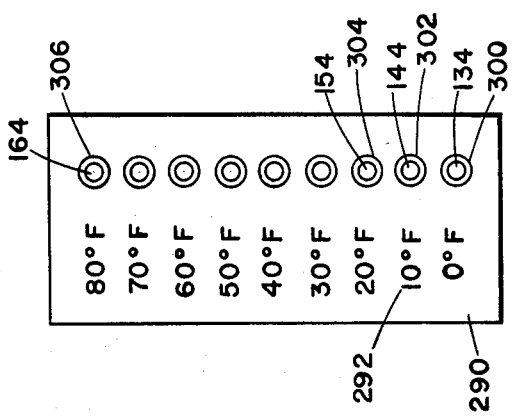
FIG. 3 is a diagrammatic illustration of the direct readout display utilizing the light emitting diodes of FIG. 1.

The light emitting diodes 134, 144, 154 and 164 provide a light display in light display panel 290 illustrated in FIG. 3. This panel display illustrates temperature readings to be selectively read and recorded, with the current high temperature being displayed. For example, when stage 240 is latched, this causes LED 134 to be turned on in recess 300 displaying a high temperature reading 0°. The temperature to be displayed are in column 292 and correspond to the stages in the memory 238. LED 144 in stage 242 displays in recess 302. Thus a constant instant visual readout is provided.

The timer 180 and reset pulse generator 190 are only illustrated as blocks since there are many integrated circuits available to perform these functions. For example, a type 556 dual timer can easily satisfy this requirement.

It should be noted that the circuit of this invention does not require any reactive components in the input circuit or within the latches. Since the input attenuator has direct access to all stages of the memory, it is possible to achieve measurement (memory) response times in the order to 25 nanoseconds. This is a dramatic improvement over the relatively slow response that can be attained with the complex arrangement of FIG. 2.

Having disclosed my invention, I now claim:

1. A system for recording and displaying input data signals comprising:
   scaling network means having parallel entry output lines responsive to input data signals for providing output signals in lines corresponding to the magnitude of the input data signals,
   memory means having a plurality of stages energized by said output signals corresponding to signals in said lines of said scaling network means,
   said memory means having means for providing a magnitude output corresponding to each of said stages energized by said scaling network,
   meter means responsive to the output of said memory output for reading the particular magnitude of the output of the memory stage energized by said scaling network,
   timer means responsive to said memory means providing an output to said meter means for providing a timed reset timing pulse,
   memory control means responsive to said reset pulse for interrupting and resetting said memory means to receive corresponding output signals from the scaling network means,
   and timer control means for restarting said timer means in mid-timing upon said memory means receiving a higher level corresponding signal from said scaling means.

2. A system for recording and displaying input data signals comprising:
   scaling network means having parallel entry output lines responsive to input data signals for providing output signals in lines corresponding to the magnitude of the input data signals,
   memory means having a plurality of stages energized by said output signals corresponding to each of said stages energized by said scaling network,
   meter means responsive to the output of said memory output for reading the particular magnitude of the output of the memory stage energized by said scaling network,
   said scaling network means having means for measuring the input magnitude of an input data signal and providing output signals in output lines in magnitude stages up to the most significant magnitude stage for the input data signal,
   said memory means having a memory stage with means responsive to a corresponding one of each of said scaling network means output lines for being energized by a corresponding output signal,
   and said memory means responsive to the most significant memory stage being energized by said scaling network output for de-energizing all less significant memory stages of said memory means,
   whereby only the most significant memory stage provides an output signal to said meter means.

3. A system as claimed in claim 2 wherein:
   the output level of said memory stages to said meter means having an output proportional to the magnitude of scaled reading of said scaling network means.

4. A system as claimed in claim 3 wherein:
   each of said memory stages comprising a latch circuit that latches in the on condition when receiving an output signal from said scaling network means,
   and each of said latch circuits including a visible indicator means for being turned on when said latch circuit is energized.

5. A system as claimed in claim 4 wherein:
   a display system comprising the visible indicator means of each of said latch circuits in said memory means,
   whereas, said visible indicator means provides a direct readout of the particular stages of said memory means that are energized providing a readout of the magnitude of the output signal being supplied to said meter means.

* * * * *